US 11,127,566 B2

(12) United States Patent
Iizuka

(10) Patent No.: US 11,127,566 B2
(45) Date of Patent: Sep. 21, 2021

(54) MULTI CHARGED PARTICLE BEAM WRITING APPARATUS AND MULTI CHARGED PARTICLE BEAM WRITING METHOD

(71) Applicant: NuFlare Technology, Inc., Yokohama (JP)

(72) Inventor: Osamu Iizuka, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 7 days.

(21) Appl. No.: 16/825,035

(22) Filed: Mar. 20, 2020

(65) Prior Publication Data

US 2020/0328060 A1 Oct. 15, 2020

(30) Foreign Application Priority Data

Apr. 11, 2019 (JP) .............................. JP2019-075739

(51) Int. Cl.
*H01J 37/317* (2006.01)
*H01J 37/302* (2006.01)
(Continued)

(52) U.S. Cl.
CPC ........ *H01J 37/3177* (2013.01); *H01J 37/045* (2013.01); *H01J 37/1471* (2013.01);
(Continued)

(58) Field of Classification Search
CPC .. H01J 37/3177; H01J 37/045; H01J 37/1471; H01J 37/243; H01J 37/3026; H01J 2237/30461; H01J 2237/31776
See application file for complete search history.

(56) References Cited

U.S. PATENT DOCUMENTS 5,283,440 A * 2/1994 Sohda .................... B82Y 10/00
250/492.1
5,751,004 A * 5/1998 Robinson ................ H01J 37/00
250/492.2
(Continued)

FOREIGN PATENT DOCUMENTS

JP 2001-93831 A 4/2001
JP 2008-530737 A 8/2008
(Continued)

*Primary Examiner* — Sean M Luck
(74) *Attorney, Agent, or Firm* — Oblon, McClelland, Maier & Neustadt, L.L.P.

(57) ABSTRACT

In one embodiment, a multi charged particle beam writing apparatus includes a measurement unit measuring a first beam shape of a multi-beam based on a beam current of each beam of the multi-beam or an intensity of charged particles reflected from a reflection mark provided on a stage, an amounts of adjustment calculator calculating amounts of adjustment of a reduction ratio and a rotation angle of the multi-beam based on the first beam shape, a correction map generation unit generating a first correction map in which an amount of displacement is defined that is obtained for each beam of the multi-beam based on a difference between a beam shape based on the amounts of adjustment and the first beam shape, a writing data processor generating shot data in which an amount of irradiation with each beam of the multi-beam is defined by converting writing data in which information regarding a graphic pattern to be written is defined, and correcting the amount of irradiation with each beam defined in the shot data based on the first correction map, and a controller controlling the reduction ratio and rotation angle of the multi-beam based on the amounts of adjustment.

12 Claims, 7 Drawing Sheets

(51) Int. Cl.
*H01J 37/04* (2006.01)
*H01J 37/147* (2006.01)
*H01J 37/24* (2006.01)

(52) U.S. Cl.
CPC ........ *H01J 37/243* (2013.01); *H01J 37/3026* (2013.01); *H01J 2237/30461* (2013.01); *H01J 2237/31776* (2013.01)

(56) References Cited

U.S. PATENT DOCUMENTS

| | | | |
|---|---|---|---|
| 6,630,681 | B1 | 10/2003 | Kojima |
| 8,552,405 | B2* | 10/2013 | Kato ................... H01J 37/3174 250/492.22 |
| 8,779,379 | B2* | 7/2014 | Nishimura ............. B82Y 40/00 250/400 |
| 9,147,552 | B2* | 9/2015 | Motosugi ............ H01J 37/3174 |
| 2002/0142496 | A1* | 10/2002 | Nakasuji ............... H01J 37/073 438/14 |
| 2008/0230711 | A1 | 9/2008 | Platzgummer et al. |
| 2009/0153749 | A1* | 6/2009 | Mixon ................. H04N 9/3173 348/744 |
| 2012/0305763 | A1* | 12/2012 | Chirko ................. G01R 33/025 250/307 |
| 2013/0252145 | A1* | 9/2013 | Matsumoto ......... H01J 37/3177 430/30 |
| 2014/0348414 | A1* | 11/2014 | Hashimoto ............. G06T 7/001 382/144 |
| 2015/0064934 | A1 | 3/2015 | Yoshikawa et al. |
| 2016/0086764 | A1 | 3/2016 | Iizuka et al. |
| 2016/0181062 | A1 | 6/2016 | Kato et al. |
| 2017/0358425 | A1* | 12/2017 | Iizuka ................. H01J 37/1474 |
| 2018/0005799 | A1 | 1/2018 | Hasegawa et al. |
| 2018/0138013 | A1 | 5/2018 | Iizuka et al. |
| 2019/0035603 | A1* | 1/2019 | Iizuka ................... H01J 37/304 |
| 2019/0103252 | A1* | 4/2019 | Kakehi ................. H01J 37/304 |

FOREIGN PATENT DOCUMENTS

| | | |
|---|---|---|
| JP | 2013-55144 A | 3/2013 |
| JP | 2016-119423 A | 6/2016 |
| JP | 2018-6604 A | 1/2018 |
| JP | 2018-78251 A | 5/2018 |
| JP | 6383228 B2 | 8/2018 |

* cited by examiner

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2019-75739, filed on Apr. 11, 2019, the entire contents of which are incorporated herein by reference.

FIELD

The present invention relates to a multi charged particle beam writing apparatus and a multi charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

Compared with a case where writing is performed using one electron beam, a writing apparatus using a multi-beam can perform irradiation with many beams at once, and thus the throughput can be greatly increased. In a multi-beam writing apparatus, for example, a multi-beam is formed by causing an electron beam emitted from an electron gun to pass through an aperture member having a plurality of openings, blanking control is performed on each beam, each beam that has not been blocked is reduced by the optical system, and a substrate placed on a movable stage is irradiated with the beam.

The multi-beam writing apparatus has a main deflector and a sub-deflector that deflect a beam and determine a beam irradiation position on the substrate. The main deflector determines the position of the entire multi-beam at a certain location on the substrate, and the sub-deflector performs deflection such that the beam pitch is filled in.

In this multi-beam writing apparatus, irradiation is performed with a plurality of beams at once, and a pattern having a desired graphic shape is written by connecting beams that are formed by the plurality of beams having passed through the same opening or different openings of the aperture member. The shape of the entire image of a multi-beam (hereinafter also described as "beam shape") irradiated onto the substrate is reflected in the connecting accuracy of the written graphic, and thus it is important to adjust the reduction ratio (enlargement-reduction ratio) and distortion of the entire image of the multi-beam.

The beam shape can be measured by scanning, while sequentially switching beams to be turned on, a reflection mark on the stage, detecting reflected electrons, and calculating the position of each beam. Hitherto, based on the measured beam shape, beam adjustment has been performed through lens excitation adjustment and beam alignment such that a desired reduction ratio and a desired rotation angle are achieved. The displacement (secondary and higher distortion components) from the ideal shape that remains after the correction based on this beam adjustment is converted into a data file as a correction map.

The amount of dose is then adjusted based on the correction map so that the beam shape becomes the ideal shape, and a pattern is written on a mask. However, when the pattern written on the mask is measured and analyzed, there may be a case where displacement from the ideal shape (the remainder of the displacement to be corrected) still exists.

In a case where the remainder of the displacement to be corrected and obtained from the writing result is simply added to the correction map, the correction amount of dose may be large, which may result in a longer writing time and lower throughput.

DETAILED DESCRIPTION

In one embodiment, a multi charged particle beam writing apparatus includes a shaping aperture array plate in which a plurality of openings are formed and that forms a multi-beam by allowing a charged particle beam to pass through the plurality of openings, a blanking aperture array plate in which a plurality of blankers are arranged that perform on-off switching on respective beams of the multi-beam, a stage on which a substrate is to be placed that is irradiated with the multi-beam, a beam shape measurement unit measuring a first beam shape of the multi-beam based on a beam current of each beam of the multi-beam or an intensity of charged particles reflected from a reflection mark provided on the stage, an amounts of adjustment calculator calculating amounts of adjustment of a reduction ratio and a rotation angle of the multi-beam based on the first beam shape measured by the beam shape measurement unit, a correction map generation unit generating a first correction map in which an amount of displacement is defined that is obtained for each beam of the multi-beam based on a difference between a beam shape based on the amounts of adjustment and the first beam shape, a writing data processor generating shot data in which an amount of irradiation with each beam of the multi-beam is defined by converting writing data in which information regarding a graphic pattern to be written is defined, and correcting the amount of irradiation with each beam defined in the shot data based on the first correction map, and a controller controlling the reduction ratio and rotation angle of the multi-beam based on the amounts of adjustment.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
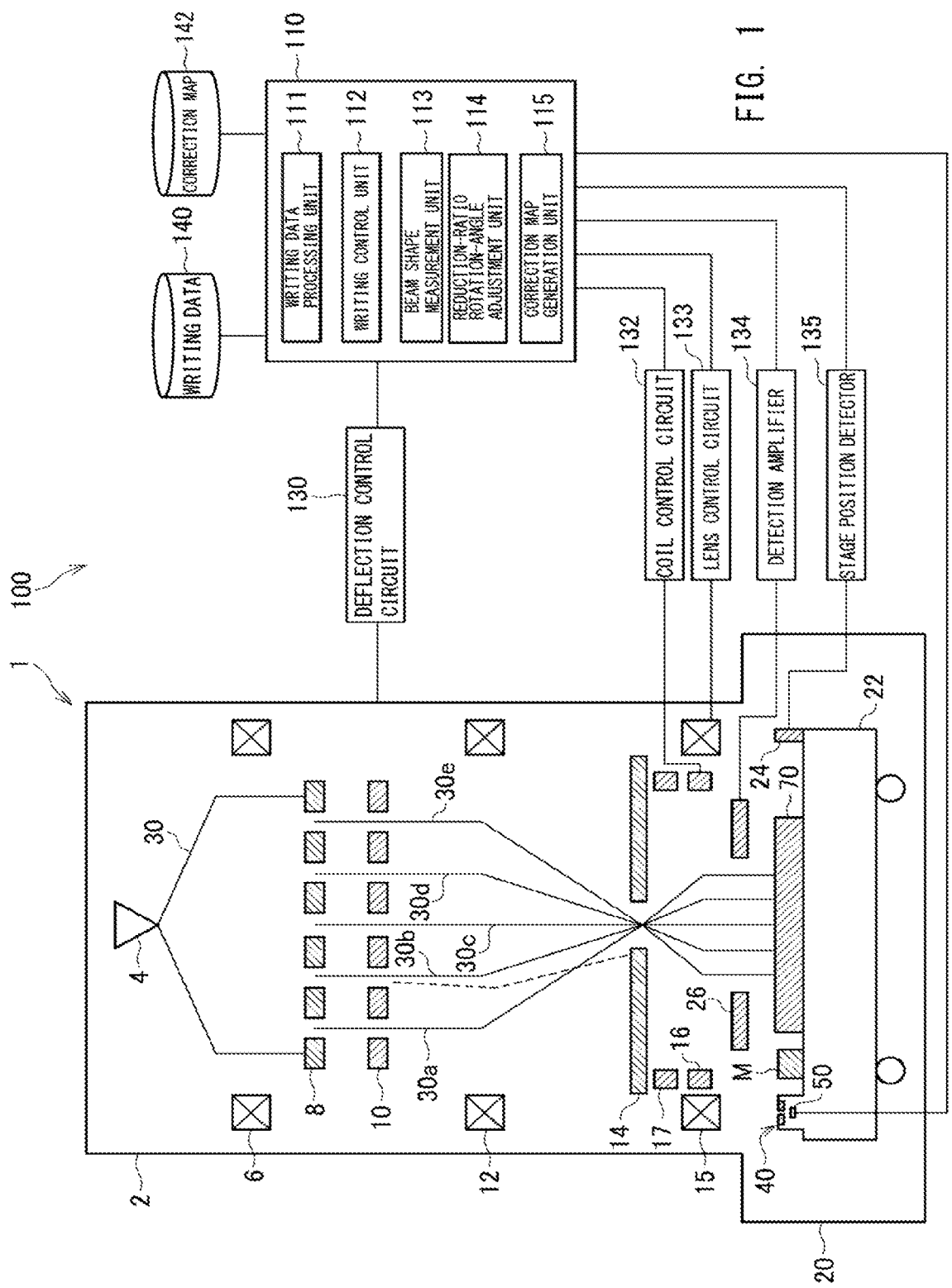
FIG. 1 is a schematic diagram of a multi charged particle beam writing apparatus according to an embodiment of the present invention.

FIG. 1 is a schematic diagram illustrating the configuration of a writing apparatus according to the present embodiment. In FIG. 1, the writing apparatus includes a writing unit 1 and a control unit 100. The writing apparatus is an example of a multi charged particle beam writing apparatus. The writing unit 1 includes a column 2 and a writing chamber 20. In the column 2, an electron gun 4, an illumination lens 6, a shaping aperture array plate 8, a blanking aperture array plate 10, a reduction lens 12, a limiting aperture plate 14, an objective lens 15, a coil 16, and a deflector 17 are arranged.

In the writing chamber 20, an XY stage 22 and a detector 26 are arranged. A substrate 70, which is a writing target, is arranged on the XY stage 22. The substrate 70 includes, for example, an exposure mask used when a semiconductor device is manufactured or a semiconductor substrate (a silicon wafer) with which a semiconductor device is manufactured. In addition, the substrate 70 includes mask blanks, on which a resist is applied and no pattern has been formed yet.

On the XY stage 22, a mirror 24 for measuring the position of the XY stage 22 is arranged. In addition, on the XY stage 22, a reflection mark M for beam calibration is provided. The reflection mark M is, for example, in the shape of a cross so that the position can be easily detected by performing a scan with an electron beam (see FIG. 5). The detector 26 detects, when the cross of the reflection mark M is scanned with an electron beam, reflected electrons from the reflection mark M. A plurality of reflection marks M may be provided.

On the XY stage 22, an inspection device including an aperture plate 40 for multi-beam inspection (hereinafter written as "inspection aperture plate 40") and a current detector 50 is arranged at a position different from the position at which the substrate 70 is placed. The height of the inspection aperture plate 40 is made adjustable by an adjustment mechanism (unillustrated). Preferably, the inspection aperture plate 40 is installed at the same height as the substrate 70.

One inspection device is provided on the XY stage 22; however, if the arrangement-and-wiring space permits, two or more inspection devices may be provided.

The control unit 100 includes a control calculator 110, a deflection control circuit 130, a coil control circuit 132, a lens control circuit 133, a detection amplifier 134, a stage position detector 135, and storage devices 140 and 142 such as a magnetic disk device.

The deflection control circuit 130, the coil control circuit 132, the lens control circuit 133, the detection amplifier 134, the stage position detector 135, and the storage devices 140 and 142 are connected to the control calculator 110 via a bus. In the storage device 140, writing data is input from the outside and stored. In the writing data, normally, information regarding a graphic pattern to be written is defined. In the storage device 142, a correction map is stored in which the amounts of displacement of individual beams of a multi-beam are defined. The correction map will be described later.

The coil 16 is connected to the coil control circuit 132. The objective lens 15 is connected to the lens control circuit 133.

The control calculator 110 includes a writing data processing unit 111, a writing control unit 112, a beam shape measurement unit 113, a reduction-ratio rotation-angle adjustment unit 114, and a correction map generation unit 115. The function of each unit of the control calculator 110 may be configured by hardware or may be configured by software. In a case where the function of each unit of the control calculator 110 is configured by software, a program that realizes at least a portion of the functions of the control calculator 110 is stored in a recording medium, and a computer including an electric circuit may be caused to read the recording medium and execute the program. The recording medium is not limited to a removable medium such as a magnetic disk or an optical disc, and a fixed recording medium such as a hard disk device or a memory may also be used.

Figure 2:
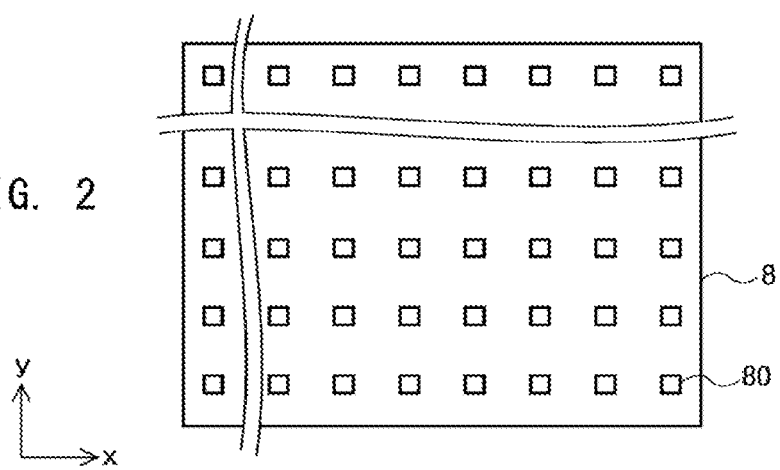
FIG. 2 is a schematic diagram of a shaping aperture array plate.

FIG. 2 is a schematic diagram illustrating the configuration of the shaping aperture array plate 8. As illustrated in FIG. 2, in the shaping aperture array plate 8, m×n openings 80 are formed at a predetermined arrangement pitch in a matrix with vertical m columns (the y direction) and horizontal n (m, n≥2) columns (the x direction). Each opening 80 is formed in a rectangular shape of the same size and shape. Each opening 80 may also be a circle of the same diameter.

An electron beam 30 emitted from the electron gun 4 is caused to almost vertically illuminate the entirety of the shaping aperture array plate 8 by the illumination lens 6. The electron beam 30 illuminates a region including all the openings 80 of the shaping aperture array plate 8. The portions of the electron beam 30 pass through the plurality of respective openings 80, and consequently a multi-beam 30a to 30e as illustrated in FIG. 1 is formed.

Pass-through holes (openings) through which the individual beams of the multi-beam pass are formed in the blanking aperture array plate 10 at positions corresponding to the respective openings 80 of the shaping aperture array plate 8 illustrated in FIG. 2. Near each of the pass-through holes, a blanking deflection electrode that deflects a beam (a blanker: a blanking deflector) is arranged.

Each beam of the multi-beam 30a to 30e passing through the pass-through holes is independently deflected by a voltage applied by the blanker. Blanking control is performed through this deflection. In this manner, each of the plurality of blankers performs blanking deflection on the corresponding one of the beams of the multi-beam having passed through the plurality of openings 80 of the shaping aperture array plate 8.

The beam size and the arrangement pitch of each beam of the multi-beam 30a to 30e, which has passed through the blanking aperture array plate 10, are reduced by the reduction lens 12, and the resulting beams advance toward the center opening formed in the limiting aperture plate 14. The trajectory of the electron beam deflected by the blanker of the blanking aperture array plate 10 is shifted, becomes misaligned from the position of the center opening of the limiting aperture plate 14, and is blocked by the limiting aperture plate 14. In contrast, the electron beam that has not been deflected by the blanker of the blanking aperture array plate 10 passes through the center opening of the limiting aperture plate 14.

The limiting aperture plate 14 blocks electron beams each of which is deflected by the blanker of the blanking aperture array plate 10 so as to be in a beam OFF state. An electron beam that has passed through the limiting aperture plate 14 in a period starting from when the state is changed to beam ON to when the beam ON is changed to beam OFF corresponds to one electron-beam shot.

The multi-beam 30a to 30e, which has passed through the limiting aperture plate 14, is caused to undergo alignment adjustment by the coil 16, is focused by the objective lens 15, and becomes a pattern image having a desired reduction ratio on the substrate 70. The deflector 17 deflects, in a collective manner and in the same direction, the individual electron beams (the entire multi-beam) that have passed through the limiting aperture plate 14, and irradiates the substrate 70 at a writing position (irradiation position) thereon with the beams.

When the XY stage 22 is moved continuously, the deflector 17 performs tracking control such that the writing position (the irradiation position) for the beams follows the movement of the XY stage 22. The position of the XY stage 22 is measured using the reflected light of a laser radiated from the stage position detector 135 toward irradiating a mirror 24 on the XY stage 22.

The multi-beam with which irradiation is performed at once is ideally arranged with a pitch obtained by multiplying the arrangement pitch of the plurality of openings 80 of the shaping aperture array plate 8 by the above-described desired reduction ratio. This writing apparatus performs a writing operation using a raster scan method in which shot beams are radiated continuously in order, and in a case where a desired pattern is written, necessary beams are controlled to enter the beam ON through blanking control in accordance with the pattern.

The writing data processing unit 111 of the control calculator 110 reads out writing data from the storage device 140, and generates shot data by performing multi-stage data conversion. A writing surface of the substrate 70 is divided into, for example, a plurality of grid-like irradiation regions having a beam size, and in the shot data, the presence or absence of irradiation of each irradiation region and the amount of irradiation (irradiation time), and so on are defined.

The writing control unit 112 outputs a control signal to the deflection control circuit 130 based on the shot data and the stage position information. The deflection control circuit 130 controls, based on the control signal, a voltage to be applied to each blanker of the blanking aperture array plate 10. In addition, the deflection control circuit 130 calculates deflection amount data (tracking deflection data) for beam deflection so that the movement of the XY stage 22 is followed. A tracking deflection voltage based on this deflection amount data is applied to the deflector 17.

In the multi-beam writing apparatus, a pattern having a desired graphic shape is written by irradiating the substrate 70, which is a writing target, with many beams at once that are arranged with the pitch obtained by multiplying the arrangement pitch of the plurality of openings 80 of the shaping aperture array plate 8 by the predetermined reduction ratio, and by connecting the beams to each other to fill in the beam pitch. Thus, the reduction ratio, rotation angle, and distortion need to be adjusted such that the shape of the entire image of the multi-beam (beam shape) that is radiated onto the substrate 70 becomes a desired shape (for example, a square).

Figure 3:
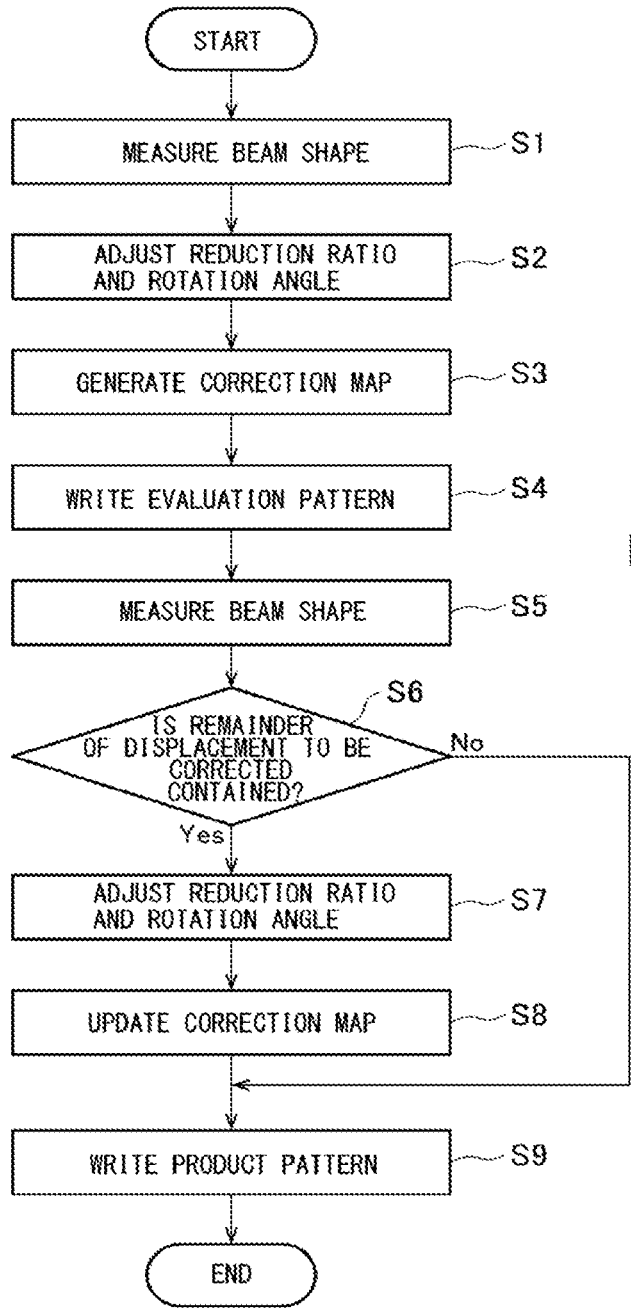
FIG. 3 is a flow chart for describing a multi charged particle beam writing method according to the embodiment.

In the present embodiment, writing is performed after the beam shape is corrected to the desired shape through adjustment of the reduction ratio, rotation angle, and distortion. A writing method according to the present embodiment will be described in accordance with the flow chart illustrated in FIG. 3.

First, a beam shape is measured in the writing apparatus (step S1). The beam shape may be measured using the inspection device having the inspection aperture plate 40 and the current detector 50, or may be measured using the reflection mark M.

Figure 4:
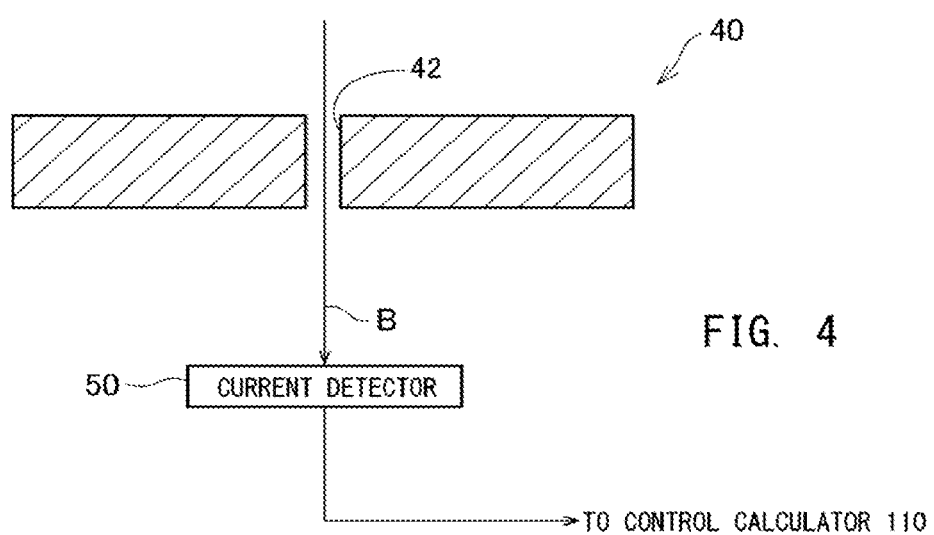
FIG. 4 is a cross section of a multi-beam inspection aperture according to the embodiment.

As illustrated in FIG. 4, the inspection aperture plate 40 of the inspection device places limitations such that only one electron beam passes therethrough. The inspection aperture plate 40 has, for example, a circular, planar shape, and a through hole 42 is formed, through which one beam passes along the center axis.

An electron beam B, which has passed through the through hole 42, enters the current detector 50, and a beam current is detected. In the current detector 50, for example, a solid-state detector (SSD), which is a semiconductor detector, can be used. A detection result from the current detector 50 is reported to the control calculator 110.

The beam shape measurement unit 113 measures the beam shape by using a beam current detection result of each beam obtained by scanning the inspection aperture plate 40 using the multi-beam.

Figure 5:
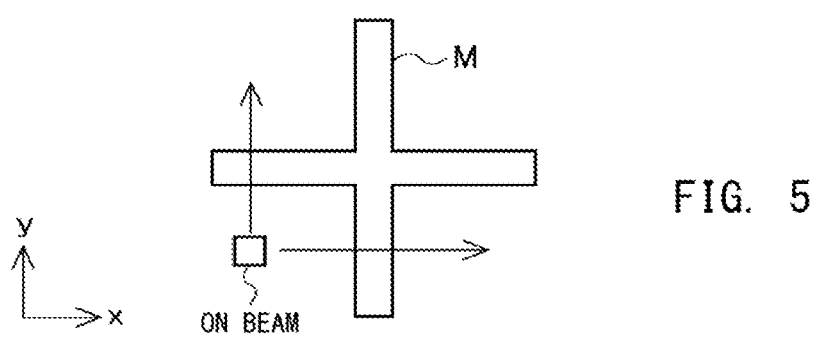
FIG. 5 is a plan view of a reflection mark.

The reflection mark M has, for example, a cross shape as illustrated in FIG. 5. The deflector 17 deflects the beam toward the front, rear, right, and left (the x direction and the y direction), and scans the cross of the reflection mark M. Reflected electrons are detected by the detector 26, amplified by the detection amplifier 134, and converted into digital data. The measurement data, which is the digital data, is then output to the control calculator 110. The beam shape measurement unit 113 calculates the position of the beam from a profile obtained by chronologically arranging the measured reflected electrons (changes in the intensity of the reflected electrons) and the stage position at the moment.

Figure 6:
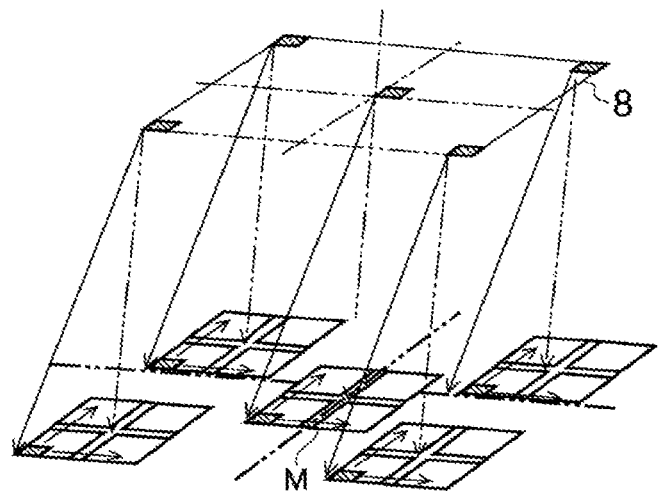
FIG. 6 is a diagram for describing a beam shape measurement method.

In a case where the beam shape is measured, only a specific beam is switched ON, the reflection mark M is moved to directly under the ON beam based on a beam size design value, and the cross of the reflection mark M is scanned to calculate the beam position. For example, as illustrated in FIG. 6, ON-beam switching is performed in turn on, for example, the beam corresponding to the center of the shaping aperture array plate 8 and the beams corresponding to the four corners, and the position of each beam is calculated and the beam shape is obtained.

Figure 7:
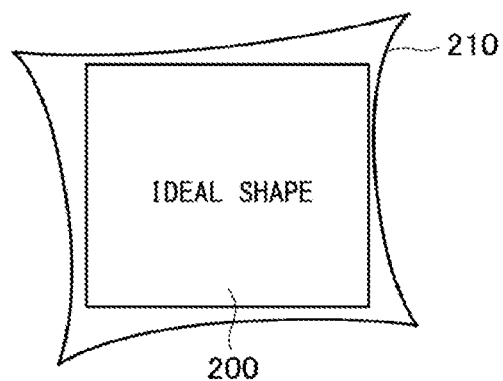
FIG. 7 is a diagram illustrating an example of an ideal beam shape and a measured beam shape.

For example, a first beam shape 210 as illustrated in FIG. 7 is measured. In order to correct this first beam shape 210 to an ideal shape 200, the reduction ratio and rotation angle (a primary component) and a distortion component (a secondary and higher component), which is other than the reduction ratio and rotation angle, need to be adjusted.

Figure 8:
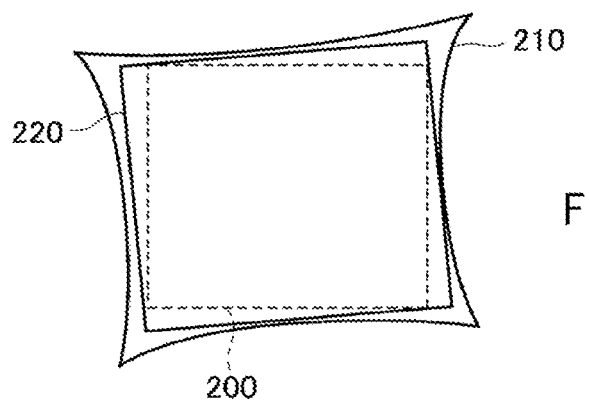
FIG. 8 is a diagram illustrating an example of a beam shape for which a reduction ratio and a rotation angle are adjusted.
Figure 9:
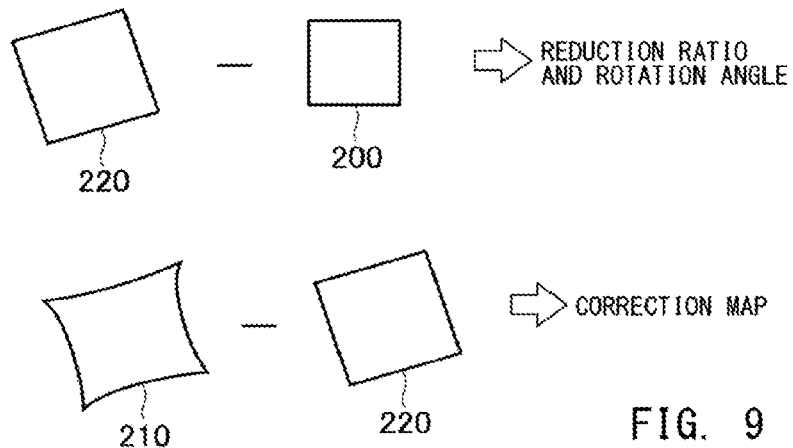
FIG. 9 is a diagram illustrating a beam shape correction portion based on the reduction ratio and rotation angle and a beam shape correction portion based on the amount of dose.

The reduction-ratio rotation-angle adjustment unit 114 (amounts of adjustment calculator) calculates the amounts of adjustment of the reduction ratio and rotation angle (the primary component) (step S2). For example, as illustrated in FIGS. 8 and 9, a second beam shape 220, which becomes the ideal shape 200 when the reduction ratio and rotation angle are adjusted, is obtained, and the amounts of adjustment for changing the second beam shape 220 to the ideal shape 200 are calculated. The amounts of adjustment are, for example, the amounts of correction for lens excitation and astigmatism. For example, in a case where the ideal shape 200 is a square, the second beam shape 220 is a square that is inscribed in the first beam shape 210.

The distortion component (the secondary and higher component), which cannot be corrected through adjustment of the reduction ratio and rotation angle (the primary component), is corrected by adjusting the amount of dose (the amount of irradiation) of each beam of the multi-beam. The correction map generation unit 115 generates a correction map (a first correction map) in which the amount of displacement of each beam due to the distortion component (the secondary and higher component) is defined in a map form (step S3). The correction map is stored in the storage device 142.

For example, as illustrated in FIGS. 8 and 9, the amounts of displacement of the individual beams corresponding to the difference between the first beam shape 210 and the second beam shape 220 are obtained.

The amounts of adjustment obtained in step S2 are set in the writing apparatus, the amount of irradiation is corrected using the correction map generated in step S3, and an evaluation pattern is written on the substrate 70 (step S4). The writing data processing unit 111 reads out writing data for the evaluation pattern from the storage device 140, and generates shot data by performing multi-stage data conversion and correcting the amount of irradiation with each beam based on the correction map. The writing unit 1 writes the evaluation pattern on the substrate 70 based on this shot data.

After the evaluation pattern is written, processing such as development and etching is performed, the evaluation pattern formed on the substrate 70 is analyzed, and the beam shape is measured (step S5).

In a case where the beam shape obtained from the writing result contains a shift from the ideal shape (the remainder of the displacement to be corrected) (step S6_Yes), the beam shape obtained from the writing result is compared with the ideal shape, and similarly to as in step S2, the reduction-ratio rotation-angle adjustment unit 114 readjusts the reduction ratio and rotation angle (the primary component) and calculates the amounts of readjustment (step S7). In addition, the correction map generation unit 115 calculates the amount of displacement of each beam due to the distortion component (the secondary and higher component), and performs an update by adding the amounts of displacement to the correction map to generate a second correction map (step S8).

Thereafter, the amounts of adjustment obtained in steps S2 and S7 are set in the writing apparatus, the amount of irradiation is corrected using the correction map (second correction map), to which updating is performed in step S8, and a product pattern is written on the substrate 70 (step S9).

Figure 10:
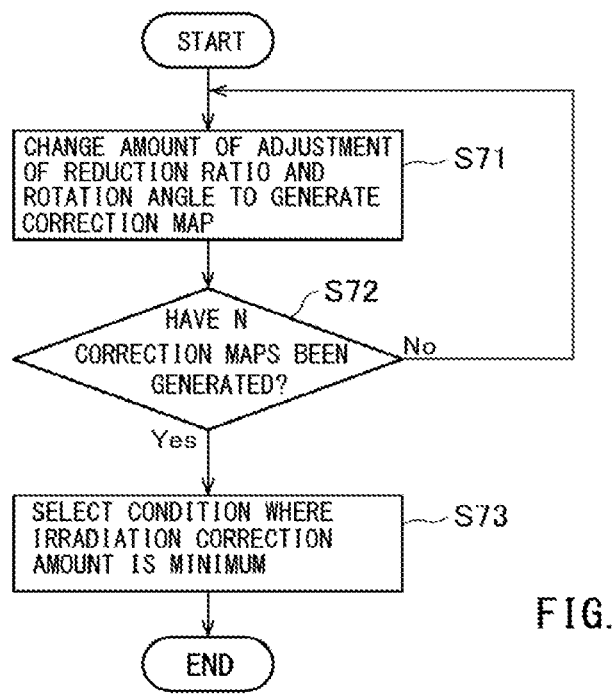
FIG. 10 is a flow chart for describing a method for adjusting the reduction ratio and rotation angle.

The amounts of adjustment of the reduction ratio and the rotation angle in steps S2 and S7 may be obtained such that the amount of correction for the amount of irradiation based on the correction map becomes small. For example, as in the flow chart illustrated in FIG. 10, the amounts of adjustment of the reduction ratio and rotation angle (the amounts of readjustment) are changed, and the correction map generation unit 115 generates N correction maps of the different amounts of adjustment (N is an integer greater than or equal to two) (steps S71 and S72). Shot data is generated from the writing data of the product pattern, and the amount of irradiation is corrected based on each of the N correction maps. Conditions for the reduction ratio and rotation angle corresponding to the correction map with which the amount of correction for the amount of irradiation is a minimum are selected (steps S72 and S73).

Figure 11A:
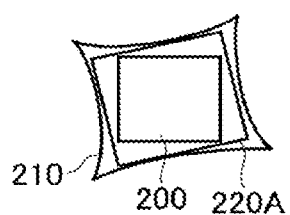
FIGS. 11A, 11B, and 11C are diagrams illustrating an example of a beam shape for which the reduction ratio and rotation angle are adjusted.
Figure 11B:
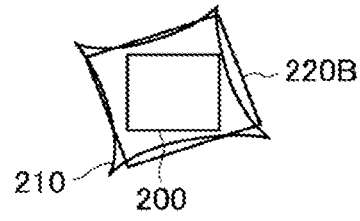
Figure 11C:
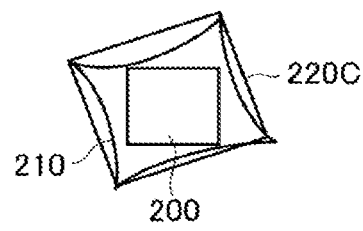

For example, as illustrated in FIGS. 11A, 11B, and 11C, second beam shapes 220A to 220C are obtained, for which conditions for the amounts of adjustment of the reduction ratio and rotation angle are different. The second beam shapes 220A to 220C have different conditions for the amounts of adjustment of the reduction ratio and rotation angle for becoming the ideal shape 200 from each other. Correction maps corresponding to respective conditions are generated from the differences between the first beam shape 210 measured by the writing apparatus or the beam shape obtained from the writing result of the evaluation pattern and the second beam shapes 220A to 220C. Shot data is generated from the writing data of the product pattern, and the amount of irradiation defined in the shot data is corrected based on each correction map. The conditions corresponding to the correction map with which the amount of correction for the amount of irradiation is a minimum are selected. For example, the conditions for the reduction ratio and rotation angle corresponding to the second beam shape 220B, with which the amount of correction for the amount of irradiation is a minimum, are selected.

In this manner, according to the present embodiment, regarding the error between the beam shape obtained from the writing result of the evaluation pattern and the ideal shape (the remainder of the displacement to be corrected), the primary component of the error that can be corrected by adjusting the reduction ratio and rotation angle is corrected using the reduction ratio and rotation angle, and the secondary and higher distortions other than the primary component are dealt with by correction of the amount of irradiation, so that the correction map is updated. Compared with a case where the remainder of the displacement to be corrected and obtained from the writing result is simply added to the correction map, the correction amount of irradiation can be suppressed, and thus the pattern can be written with high accuracy while increasing the throughput.

In addition, the throughput can further be increased by adjusting the reduction ratio and rotation angle such that the correction amount of irradiation becomes smaller.

In the embodiment described above, the reduction ratio and rotation angle may be adjusted by adjusting an electrostatic lens during the writing processing or may also be adjusted by adjusting excitation of an electromagnetic lens while the writing processing is not performed.

In the embodiment described above, the configuration has been described in which the inspection device, which includes the inspection aperture plate 40 and the current detector 50, and the detector 26, which detects reflected electrons from the reflection mark M, are provided as the measurement unit that measures the beam shape of the multi-beam; however, only either one of the two may be provided in the configuration.

The correction map may be adjusted in accordance with the type of resist applied onto the substrate 70, which is a writing target.

While certain embodiments have been described, these embodiments have been presented by way of example only, and are not intended to limit the scope of the inventions. For example, although the above embodiments employ the variable formation beam that is shaped at each shot and is irradiated, a beam having a definite shape may be irradiated. A plurality of beams can be irradiated simultaneously. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
   a shaping aperture array plate in which a plurality of openings are formed and that forms a multi-beam by allowing a charged particle beam to pass through the plurality of openings;
   a blanking aperture array plate in which a plurality of blankers are arranged that perform on-off switching on respective beams of the multi-beam;
   a stage on which a substrate is to be placed that is irradiated with the multi-beam;
   a beam shape measurement unit measuring a first beam shape of the multi-beam based on a beam current of each beam of the multi-beam or an intensity of charged particles reflected from a reflection mark provided on the stage;
   an amounts of adjustment calculator calculating amounts of adjustment of a reduction ratio and a rotation angle of the multi-beam based on the first beam shape measured by the beam shape measurement unit;
   a correction map generation unit generating a first correction map in which an amount of displacement is defined that is obtained for each beam of the multi-beam based on a difference between a beam shape based on the amounts of adjustment and the first beam shape;
   a writing data processor generating shot data in which an amount of irradiation with each beam of the multi-beam is defined by converting writing data in which information regarding a graphic pattern to be written is defined, and correcting the amount of irradiation with each beam defined in the shot data based on the first correction map; and
   a controller controlling the reduction ratio and rotation angle of the multi-beam based on the amounts of adjustment.

2. The apparatus according to claim 1, wherein the correction map generation unit generates a plurality of first correction maps by changing a condition for the amounts of adjustment, and selects the condition for the amounts of adjustment corresponding to the first correction map with which the amount of correction for the amount of irradiation is a minimum among the plurality of first correction maps.

3. The apparatus according to claim 1, wherein a second beam shape of the multi-beam is measured from a writing result of an evaluation pattern written on the substrate after the reduction ratio and rotation angle of the multi-beam are adjusted based on the amounts of adjustment and the amount of irradiation with each beam of the multi-beam is corrected based on the first correction map, and the amounts of adjustment calculator readjusts the reduction ratio and rotation angle of the multi-beam based on the second beam shape,
   the correction map generation unit obtains the amount of displacement of each beam of the multi-beam using a difference between the second beam shape and a beam shape based on the readjusted reduction ratio and rotation angle, and generates a second correction map by adding the amount of displacement to the first correction map, and
   the writing data processor corrects the amount of irradiation with each beam defined in the shot data based on the second correction map.

4. The apparatus according to claim 2, wherein a second beam shape of the multi-beam is measured from a writing result of an evaluation pattern written on the substrate after the reduction ratio and rotation angle of the multi-beam are adjusted based on the amounts of adjustment and the amount of irradiation with each beam of the multi-beam is corrected based on the first correction map, and the amounts of adjustment calculator readjusts the reduction ratio and rotation angle of the multi-beam based on the second beam shape,
   the correction map generation unit obtains the amount of displacement of each beam of the multi-beam using a difference between the second beam shape and a beam shape based on the readjusted reduction ratio and rotation angle, and generates a second correction map by adding the amount of displacement to the first correction map, and
   the writing data processor corrects the amount of irradiation with each beam defined in the shot data based on the second correction map.

5. The apparatus according to claim 3, wherein a plurality of second correction maps are generated by changing a condition for the amounts of readjustment of the reduction ratio and rotation angle, and
   the condition for the amounts of readjustment corresponding to the second correction map with which the amount of correction performed for the amount of irradiation by the writing data processor is a minimum among the plurality of second correction maps is selected.

6. The apparatus according to claim 4, wherein a plurality of second correction maps are generated by changing a condition for the amounts of readjustment of the reduction ratio and rotation angle, and
   the condition for the amounts of readjustment corresponding to the second correction map with which the amount of correction performed for the amount of irradiation by the writing data processor is a minimum among the plurality of second correction maps is selected.

7. A multi charged particle beam writing method comprising:
   emitting a charged particle beam;
   forming a multi-beam by allowing the charged particle beam to pass through a plurality of openings of a shaping aperture array plate;
   performing on-off switching on respective beams of the multi-beam by use of a plurality of blankers;
   measuring a first beam shape of the multi-beam based on a beam current of each beam of the multi-beam or an intensity of charged particles reflected from a reflection mark provided on a stage, on which a substrate is to be placed;
   calculating amounts of adjustment of a reduction ratio and a rotation angle of the multi-beam based on a measurement result of the first beam shape;
   generating a first correction map in which an amount of displacement is defined that is obtained for each beam of the multi-beam based on a difference between a beam shape based on the amounts of adjustment and the measurement result of the first beam shape;
   generating shot data in which an amount of irradiation with each beam of the multi-beam is defined by converting writing data in which information regarding a graphic pattern to be written is defined, and correcting the amount of irradiation with each beam defined in the shot data based on the first correction map; and
   controlling the reduction ratio and rotation angle of the multi-beam based on the amounts of adjustment.

8. The method according to claim 7, wherein a plurality of first correction maps are generated by changing a condition for the amounts of adjustment, and the condition for the amounts of adjustment corresponding to the first correction map with which the amount of correction for the amount of irradiation is a minimum among the plurality of first correction maps is selected.

9. The method according to claim 7, wherein a second beam shape of the multi-beam is measured from a writing result of an evaluation pattern written on the substrate after the reduction ratio and rotation angle of the multi-beam are adjusted based on the amounts of adjustment and the amount of irradiation with each beam of the multi-beam is corrected based on the first correction map, and the reduction ratio and rotation angle of the multi-beam are readjusted based on the second beam shape, the amount of displacement of each beam of the multi-beam is obtained using a difference between the second beam shape and a beam shape based on the readjusted reduction ratio and rotation angle, and a second correction map is generated by adding the amount of displacement to the first correction map, and the amount of irradiation with each beam defined in the shot data is corrected based on the second correction map.

10. The method according to claim 8, wherein a second beam shape of the multi-beam is measured from a writing result of an evaluation pattern written on the substrate after the reduction ratio and rotation angle of the multi-beam are adjusted based on the amounts of adjustment and the amount of irradiation with each beam of the multi-beam is corrected based on the first correction map, and the reduction ratio and rotation angle of the multi-beam are readjusted based on the second beam shape, the amount of displacement of each beam of the multi-beam is obtained using a difference between the second beam shape and a beam shape based on the readjusted reduction ratio and rotation angle, and a second correction map is generated by adding the amount of displacement to the first correction map, and the amount of irradiation with each beam defined in the shot data is corrected based on the second correction map.

11. The method according to claim 9, wherein a plurality of second correction maps are generated by changing a condition for the amounts of readjustment of the reduction ratio and rotation angle, and the condition for the amounts of readjustment corresponding to the second correction map with which the amount of correction for the amount of irradiation is a minimum among the plurality of second correction maps is selected.

12. The method according to claim 10, wherein a plurality of second correction maps are generated by changing a condition for the amounts of readjustment of the reduction ratio and rotation angle, and the condition for the amounts of readjustment corresponding to the second correction map with which the amount of correction for the amount of irradiation is a minimum among the plurality of second correction maps is selected.

* * * * *